United States Patent
Huang et al.

(10) Patent No.: US 11,404,524 B2
(45) Date of Patent: Aug. 2, 2022

(54) DISPLAY PANEL, DISPLAY MODULE, AND ELECTRONIC DEVICE

(71) Applicant: Wuhan China Star Optoelectronics Semiconductor Display Technology Co., Ltd., Wuhan (CN)

(72) Inventors: Shiqiang Huang, Wuhan (CN); Xing Ming, Wuhan (CN); Qi Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 228 days.

(21) Appl. No.: 16/956,590

(22) PCT Filed: Apr. 14, 2020

(86) PCT No.: PCT/CN2020/084662
§ 371 (c)(1),
(2) Date: Jun. 21, 2020

(87) PCT Pub. No.: WO2021/189565
PCT Pub. Date: Sep. 30, 2021

(65) Prior Publication Data
US 2022/0140045 A1 May 5, 2022

(30) Foreign Application Priority Data
Mar. 26, 2020 (CN) .......................... 202010222245.4

(51) Int. Cl.
*H01L 51/52* (2006.01)
*H01L 27/32* (2006.01)

(52) U.S. Cl.
CPC ...... *H01L 27/3276* (2013.01); *H01L 27/3246* (2013.01)

(58) Field of Classification Search
CPC ..... H01L 51/52; H01L 51/5221; H01L 27/32; H01L 27/324; H01L 27/327; H01L 27/328; H01L 27/3246; H01L 27/3276; H01L 27/3288
USPC .......................................................... 257/40
See application file for complete search history.

(56) References Cited

U.S. PATENT DOCUMENTS

| 2008/0252207 A1 | 10/2008 | Yamazaki et al. |
| 2013/0099218 A1 | 4/2013 | Lee et al. |
| 2016/0253954 A1* | 9/2016 | Yang .................. H01L 27/3211 345/690 |
| 2018/0323249 A1* | 11/2018 | Kim .................. H01L 27/3276 |

(Continued)

FOREIGN PATENT DOCUMENTS

| CN | 103066212 | 4/2013 |
| CN | 103137891 | 6/2013 |

(Continued)

*Primary Examiner* — Fazli Erdem

(57) ABSTRACT

A display panel, a display module, and an electronic device are provided. The display panel includes a third metal layer including a signal line, and a conductive layer including a connection portion. The connection portion is connected to the signal line. A pixel definition layer is disposed on the conductive layer, and the pixel definition layer includes a first opening region and a second opening region. A cathode is disposed in the second opening region and disposed on the pixel definition layer. The cathode is connected to the connection portion.

18 Claims, 5 Drawing Sheets

(56) References Cited

U.S. PATENT DOCUMENTS

2019/0140195 A1 5/2019 Zhao et al.
2020/0185480 A1 6/2020 Heo

FOREIGN PATENT DOCUMENTS

| | | |
|---|---|---|
| CN | 105742324 | 7/2016 |
| CN | 106057844 | 10/2016 |
| CN | 106206673 | 12/2016 |
| CN | 106409870 | 2/2017 |
| CN | 106784375 | 5/2017 |
| CN | 107565041 | 1/2018 |
| CN | 107819021 | 3/2018 |
| CN | 108037615 | 5/2018 |
| CN | 107342304 | 11/2018 |
| CN | 110176483 | 8/2019 |
| CN | 110429088 | 11/2019 |

* cited by examiner

DISPLAY PANEL, DISPLAY MODULE, AND ELECTRONIC DEVICE

RELATED APPLICATIONS

This application is a National Phase of PCT Patent Application No PCT/CN2020/084662 having International filing date of Apr. 14, 2020, which claims the benefit of priority of Chinese Patent Application No. 202010222245.4 filed on Mar. 26, 2020. The contents of the above applications are all incorporated by reference as if fully set forth herein in their entirety.

FIELD AND BACKGROUND OF THE INVENTION

The invention relates to the field of display technologies, in particular to a display panel, a display module, and an electronic device.

BACKGROUND OF INVENTION

At present, organic light-emitting diode display panels can be divided into two structures of bottom emission and top emission according to different light-emitting directions. Light of the bottom emission structure is transmitted through an anode. Because wiring density on a side of an array substrate is high, light transmittance is low; therefore, the bottom emission structure is often used for products with large sizes and low pixel densities. In the top emission structure, light emitted by an organic light-emitting diode is transmitted through a cathode.

However, along with increasing sizes of the organic light-emitting diode display panels and larger impedance of a cathode material itself, this causes a cathode voltage at a far end of an input to drop significantly, thereby reducing uniformity of an in-plane cathode voltage, and thus causing uneven brightness.

Therefore, it is necessary to provide a display panel, a display module, and an electronic device to solve the problems in the conventional art.

SUMMARY OF THE INVENTION

An object of the present invention is to provide a display panel, a display module, and an electronic device, which can improve uniformity of brightness.

To solve the above technical problems, the present invention provides a display panel, including:

a substrate;

a semiconductor layer disposed on the substrate;

a first metal layer disposed on the semiconductor layer, the first metal layer including a gate;

a third metal layer disposed on the first metal layer, the third metal layer including a signal line;

a conductive layer disposed on the third metal layer, wherein the conductive layer includes an anode and a connection portion, and the connection portion is connected to the signal line;

a pixel definition layer disposed on the conductive layer, the pixel definition layer including a first opening region and a second opening region;

a light-emitting layer positioned in the first opening region; and a cathode disposed in the second opening region, and disposed on the light-emitting layer and the pixel definition layer, wherein the cathode is connected to the connection portion.

The present invention further provides a display module including the above display panel.

The invention further provides an electronic device including the above display module.

The display panel, display module, and electronic device of the present invention include a third metal layer disposed on a first metal layer, the third metal layer includes a signal line, a conductive layer is disposed on the third metal layer, and the conductive layer includes an anode and a connection portion. The connection portion is connected to the signal line. A pixel definition layer is disposed on the conductive layer, and the pixel definition layer includes a first opening region and a second opening region. A light-emitting layer is positioned in the first opening region, and a cathode is disposed in the second opening region and disposed on the light-emitting layer and the pixel definition layer. The cathode is connected to the connection portion, and because the cathode is connected to the signal line, impedance of the cathode is reduced, making an in-plane cathode voltage distribution uniform, thereby improving uniformity of brightness.

DESCRIPTION OF SPECIFIC EMBODIMENTS OF THE INVENTION

Figure 1:
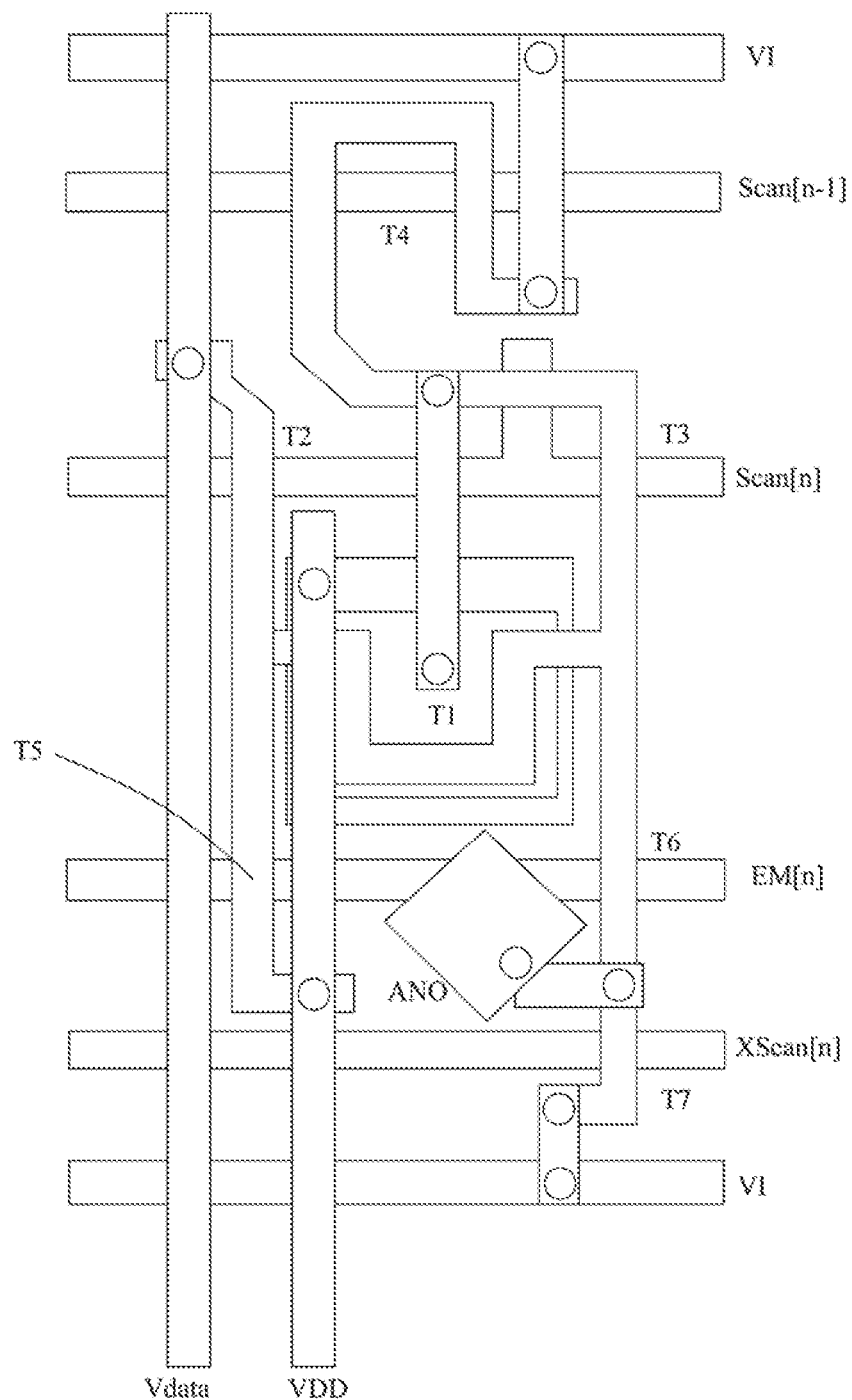
FIG. 1 is a schematic structural diagram of a conventional pixel driving circuit.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The terms "first", "second", and the like in the description and claims of the present application and the above-mentioned drawings are configured to distinguish different objects, rather than describing a specific order. Furthermore, the terms "including" and "having", as well as any modification of them, are intended to cover non-exclusive inclusions.

Figure 2:
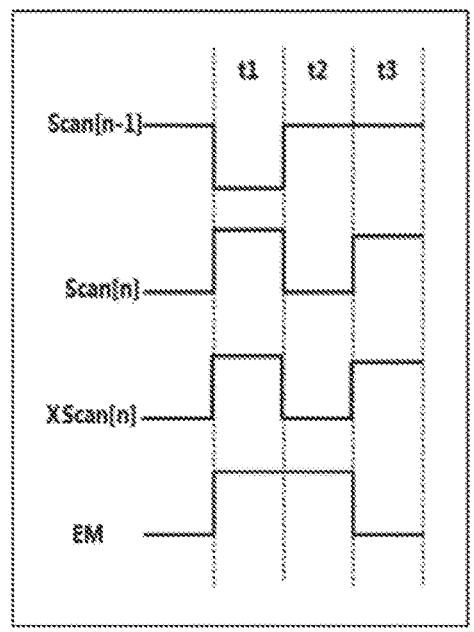
FIG. 2 is a schematic working sequence diagram of the pixel driving circuit shown in FIG. 1.

As shown in FIG. 1 and FIG. 2, a conventional seven transistors and one capacitor (7T1C) pixel driving circuit includes a driving transistor T1 and transistors from a second transistor T2 to a seventh transistor T7.

A gate of the second transistor T2 is connected to a second scan signal Scan [n], a source of the second transistor is connected to a data voltage Vdata, and a drain of the second transistor is connected to a source of the driving transistor T1.

A gate of the driving transistor T1 is connected to a source of a third transistor T3, and a drain of the driving transistor is connected to a drain of the third transistor T3.

A gate of a fifth transistor T5 is connected to a light-emitting signal EM, a source of the fifth transistor is connected to a data voltage VDD, and a drain of the fifth transistor is connected to the source of the driving transistor T1.

A gate of the third transistor T3 is connected to the second scan signal Scan [n], and the drain of the third transistor is connected to the drain of the driving transistor T1.

A gate of a fourth transistor T4 is connected to a first scan signal Scan [n−1], a source of the fourth transistor is connected to the source of the third transistor T3, both a drain of the fourth transistor and a source of the seventh transistor T7 are connected to a low-level signal VI.

A gate of a sixth transistor T6 is connected to the light-emitting signal EM, a source of the sixth transistor is connected to the drain of the driving transistor T1, a drain of the sixth transistor is connected to a drain of the seventh transistor T7 and an organic light-emitting diode, and a gate of the seventh transistor T7 is connected to a third scan signal XScan [n].

Specific working process includes following phases.

The working process of the pixel driving circuit is divided into three phases: an initialization phase (t1), a threshold voltage compensation phase (t2), and a light-emitting phase (t3), details are as follows.

Taking transistors T1 to T7 as P-type transistors as an example, the initialization phase (t1): the first scan signal Scan [n−1] outputs a low level, the transistor T4 is turned on, then, the second scan signal Scan [n], the third scan signal XScan [n], and the light-emitting signal EM output a high level, so that the transistors T2, T3, T5, T6, and T7 are turned off, and the low-level signal VI (low potential) resets the gate of the driving transistor T1 through the transistor T4.

The threshold voltage compensation phase (t2): the first scan signal Scan [n−1] and the light-emitting signal EM output high level, so that transistors T4, T5, T6 are turned off, the second scan signal Scan [n] and the third scan signal XScan [n] output low level, so that the transistors T2, T3, T7 are turned on. The gate of the driving transistor T1 in the previous phase is low, the driving transistor T1 is in a conduct state, the data voltage Vdata charges the gate of the driving transistor T1 through the transistors T2, T1, T3, while a potential difference between the gate and the source of the driving transistor T1 is its threshold voltage (ie., VA−Vdata=Vth), the driving transistor T1 no longer satisfies condition of the conduct state, and the threshold voltage compensation phase ends. At this time, a potential of the gate of the driving transistor T1 is: Vdata+Vth, and the low-level signal VI resets an anode of the light-emitting device through the seventh transistor T7.

The light-emitting phase (t3): the first scan signal Scan [n−1], the second scan signal Scan [n], and the third scan signal XScan [n] output high level, so that transistors T2, T3, T4, and T7 are turned off, the light-emitting signal EM outputs low level, so that the transistors T5 and T6 are turned on, the data voltage VDD supplies power to the anode of the light-emitting device through the transistors T5, T1, and T6, and the driving transistor T1 outputs a current to drive the light-emitting device to emit light.

Figure 3:
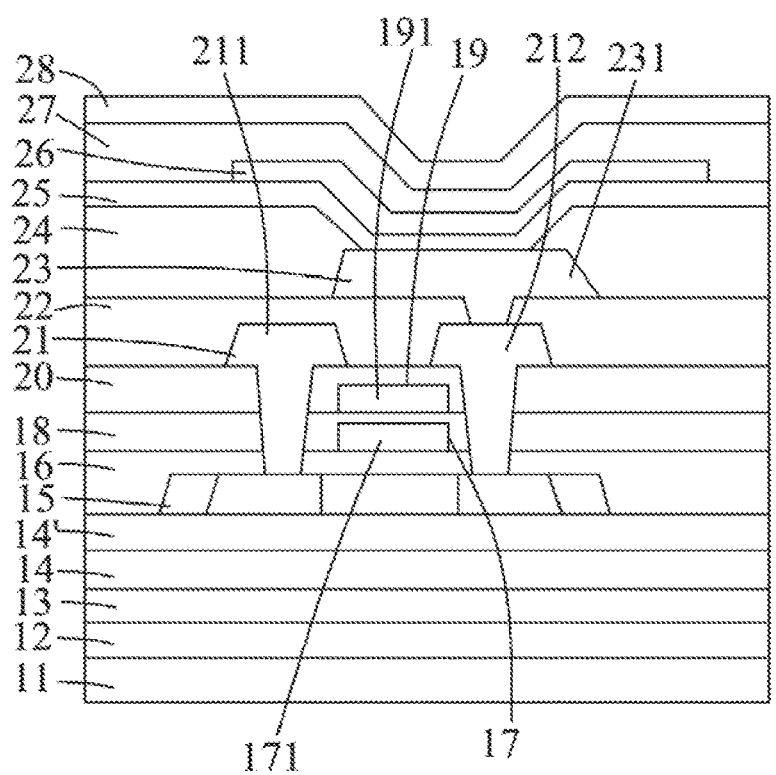
FIG. 3 is a schematic cross-sectional view of a conventional display panel.

As shown in FIG. 3, a conventional display panel includes a first flexible substrate 11, a first barrier layer 12, a second flexible substrate 13, a second barrier layer 14, a buffer layer 14', a semiconductor layer 15 (Poly), a first insulating layer 16, a gate 171, a second insulating layer 18, a metal portion 191, a third insulating layer 20, a source 211, a drain 212, a planarization layer 22, an anode 231 (ANO), a pixel definition layer 24 (PDL), a first functional layer 25, a light-emitting layer 26, a second functional layer 27, and a cathode 28 (cathode), etc.

Figure 4:
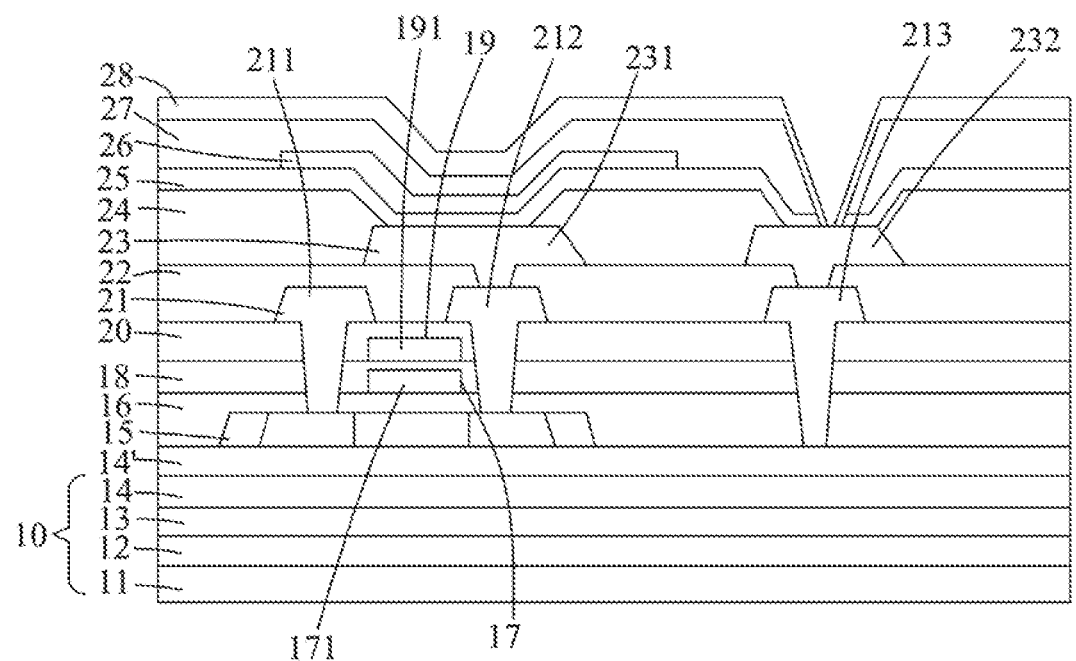
FIG. 4 is a schematic cross-sectional view of a display panel according to an embodiment of the present invention.

Please refer to FIGS. 4 to 7. FIG. 4 is a schematic cross-sectional view of a display panel according to an embodiment of the present invention.

As shown in FIG. 4, the display panel of the present embodiment includes a substrate 10, a semiconductor layer 15, a first metal layer 17, a second metal layer 19, a conductive layer 23, a pixel definition layer 24, a light-emitting layer 26, and a cathode 28. In addition, at least one of the buffer layer 14', the first insulating layer 16, the second insulating layer 18, the third insulating layer 20, or the planarization layer 22 can be included.

The substrate 10 can be a flexible substrate or a glass substrate. In an embodiment, the substrate 10 can include a first flexible substrate 11, a first barrier layer 12, a second flexible substrate 13, and a second barrier layer 14. Materials of the first flexible substrate 11 and the second flexible substrate 13 can both be polyimide.

The buffer layer 14' is disposed on the substrate 10. Material of the buffer layer 14' can include at least one of $SiN_x$ or $SiO_2$.

The semiconductor layer 15 is disposed on the buffer layer 14'. Material of the semiconductor layer 15 can be polysilicon.

The first insulating layer 16 is disposed on the semiconductor layer 15. Material of the first insulating layer 16 includes at least one of $SiN_x$ or $SiO_2$.

The first metal layer 17 is disposed on the first insulating layer 16, and the first metal layer 17 includes a gate 171.

The second insulating layer 18 is disposed on the first metal layer 17, and material of the second insulating layer 18 includes at least one of $SiN_x$ or $SiO_2$.

The second metal layer 19 is disposed on the second insulating layer 18, and the second metal layer 19 includes a metal portion 191 corresponding to a position of the gate 171. The metal portion 191 and the gate 171 form a capacitance.

The third insulating layer 20 is disposed on the second metal layer 19, and material of the third insulating layer 20 includes at least one of $SiN_x$ or $SiO_2$. In an embodiment, in order to further improve uniformity of brightness, the third insulating layer 20 is provided with a first via (not shown in the figure), and the first via penetrates the first insulating layer 16, the second insulating layer 18, and the third insulating layer 20.

The third metal layer 21 is disposed on the third insulating layer 20. The third metal layer 21 includes a signal line 213. A first power supply voltage is connected to the signal line 213, and the first power supply voltage is less than a preset value. The first power supply voltage can be a low-level direct current (DC) voltage. In an embodiment, the third metal layer 21 is also disposed in the first via to form the signal line 213. In an embodiment, in order to simplify a manufacturing process and reduce production costs, the third metal layer 21 includes the source 211 and the drain 212, that is, the signal line 213, the source 211, and the drain 212 are positioned in a same metal layer. The first via corresponds to a position of the signal line 213.

The planarization layer 22 is disposed on the third metal layer 21, a second connection hole (not shown in the figure) is defined in the planarization layer 22, and a connection portion 232 is connected to the signal line 213 through the second connection hole. The second connection hole corresponds to a position of the connection portion 232.

The conductive layer 23 is disposed on the planarization layer 22, and the conductive layer 23 includes the anode 231 and the connection portion 232. The connection portion 232 is connected to the signal line 213. Material of the conductive layer 23 is a transparent conductive material, indium tin oxide for example.

Figure 5:
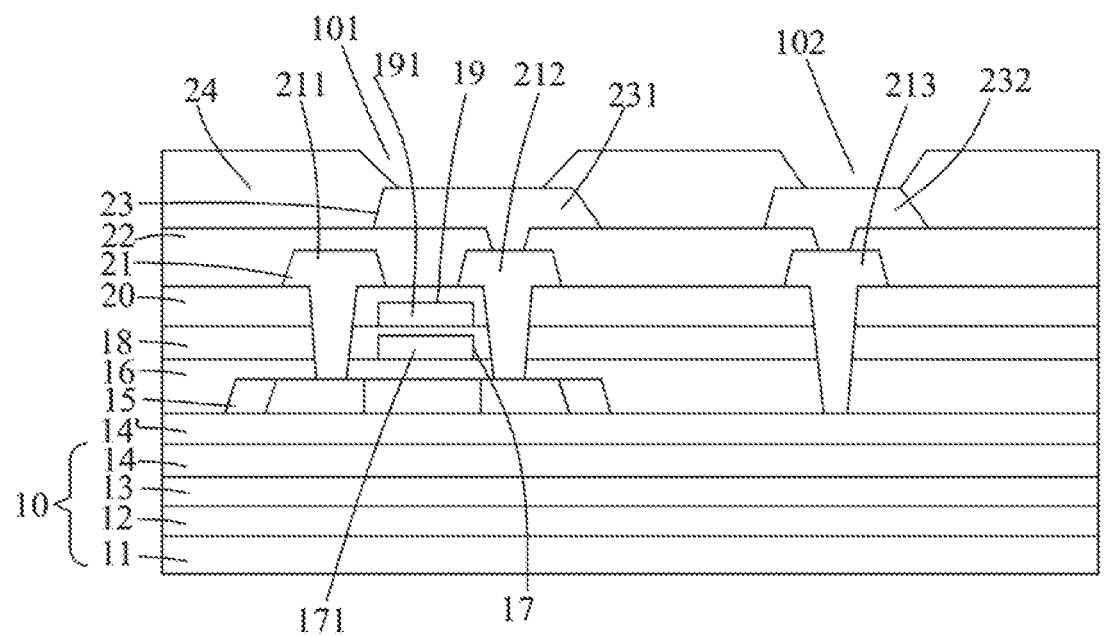
FIG. 5 is a schematic structural diagram of a fifth step of a method of manufacturing a display panel according to an embodiment of the present invention.

With reference to FIG. 5, the pixel definition layer 24 is disposed on the conductive layer 23. The pixel definition layer 24 includes a first opening region 101 and a second opening region 102.

The light-emitting layer 26 is positioned in the first opening region 101.

The cathode 28 is disposed in the second opening region 102 and on the light-emitting layer 26 and the pixel definition layer 24. The cathode 28 is connected to the connection portion 232. The cathode 28 can be made of magnesium-silver alloy (Mg/Ag). In an embodiment, a thickness of the cathode 28 is about 100 Å, and impedance of the cathode 28 layer is less than 20Ω.

In addition, the display panel can further include a first functional layer 25 and a second functional layer 27.

The first functional layer 25 is disposed between the pixel definition layer 24 and the light-emitting layer 26. The first functional layer 25 can include a hole injection layer and a hole transport layer.

Figure 6:
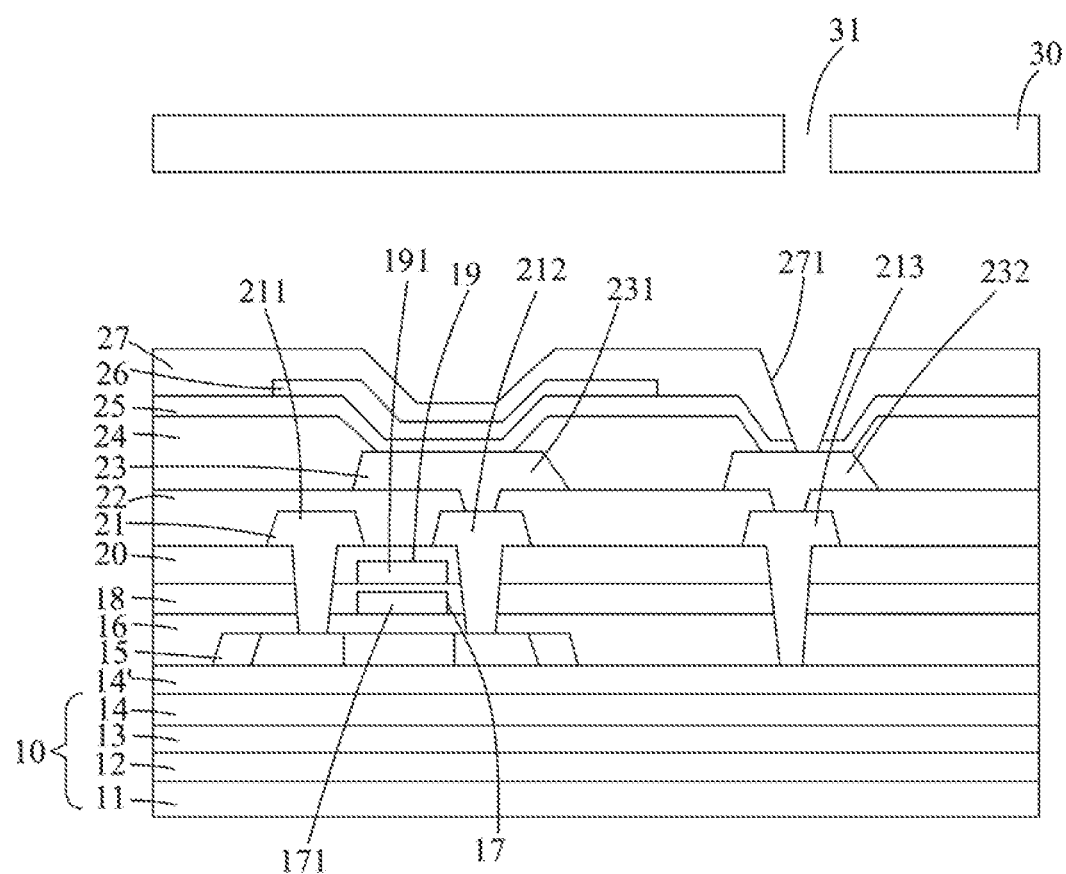
FIG. 6 is a schematic structural diagram of an eighth step of the method of manufacturing the display panel according to an embodiment of the present invention.

The second functional layer 27 is disposed between the light-emitting layer 26 and the cathode 28. Referring to FIG. 6, the second functional layer 27 is provided with a first connection hole 271, and the first connection hole 271 penetrates the second functional layer 27 and the first functional layer 25, and the cathode 28 is connected to the connection portion 232 through the first connection hole 271. The second functional layer 27 can include an electron transport layer and an electron injection layer.

In addition, the display panel can further include a film layer such as an encapsulation layer and/or a cover plate.

In another embodiment, the first metal layer 17 can further include a second conductive portion (not shown in the figure), and the signal line 213 is connected to the second conductive portion. In yet another embodiment, the second metal layer 19 includes a first conductive portion, and the signal line 213 is connected to the first conductive portion (not shown in the figure). In the meantime, the signal line 213 is used to connect the connection portion 232 to the first conductive portion or the second conductive portion.

Figure 7:
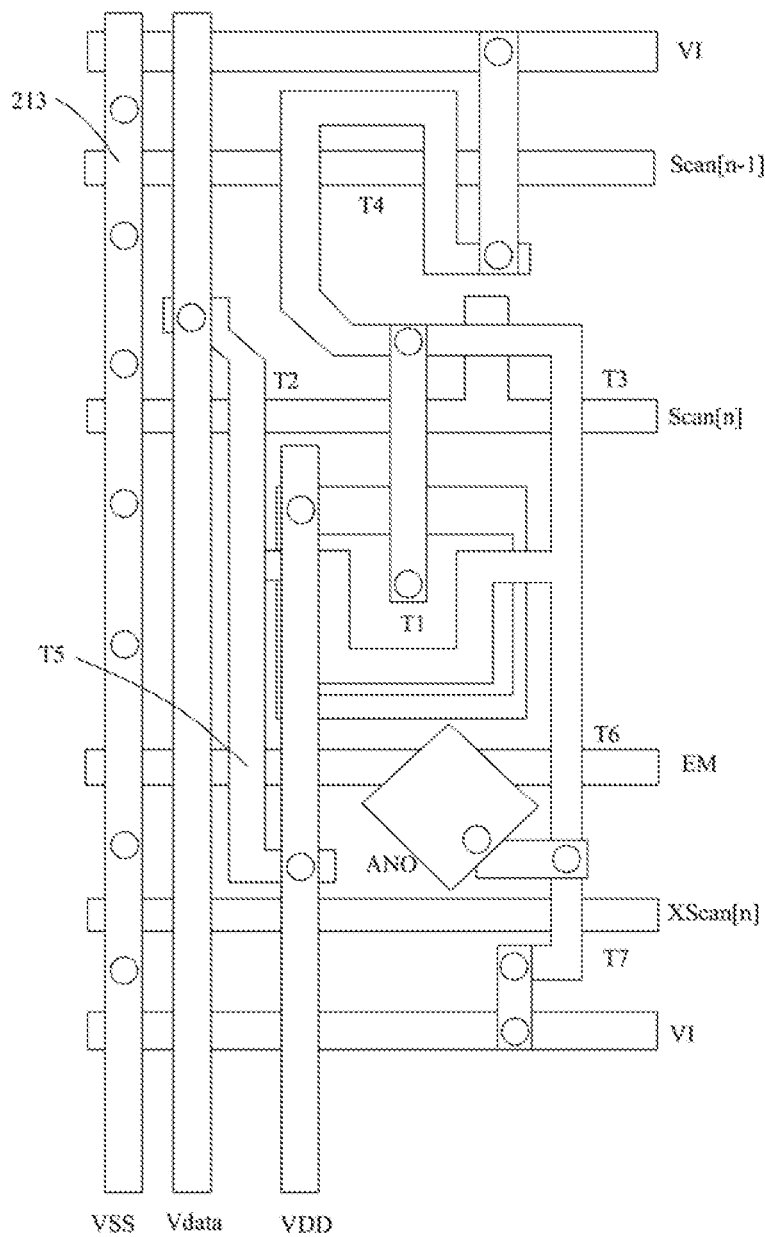
FIG. 7 is a schematic structural diagram of a pixel driving circuit according to an embodiment of the present invention.

A schematic structural diagram of a pixel driving circuit corresponding to the above display panel is shown in FIG. 7. In FIG. 7, the signal line 213 is added compared to FIG. 1, and the signal line 213 is connected to the cathode. A voltage connected to the signal line 213 is same as a voltage connected to the cathode, wherein the signal line 213 and the cathode are both connected to the power supply low voltage VSS.

Since the cathode 28 is connected to the signal line 213, a supply of the in-plane cathode 28 can be increased, impedance of the cathode 28 can be reduced, and a cathode voltage at a far end of an input is same as that at a near end of the input, preventing a cathode voltage drop at the far end of the input. Therefore, an in-plane cathode voltage distribution is uniform, thus improving uniformity of brightness.

It can be understood that FIG. 4 only shows the structure of the display panel in an embodiment, but does not limit the present invention. In an embodiment, referring to FIG. 5 and FIG. 6, a method of manufacturing the above display panel includes follows.

S101, fabricating the semiconductor layer 15, the first insulating layer 16, the gate 171, the second insulating layer 18, the metal portion 191, and the third insulating layer 20 sequentially on the substrate 10, and fabricating the first via and the second via in the third insulating layer 20.

Wherein, the first via penetrates the third insulating layer 20, the second insulating layer 18, and the first insulating layer 16, the source 211 and the drain 212 are connected to the semiconductor layer 15 through the second via.

S102, fabricating the third metal layer 21 in the first via, the second via, and on the third insulating layer 20, and patterning the third metal layer 21 to form the source 211, the drain 212, and the signal line 213.

The patterning process can include steps such as exposure, development, and etching.

S103, fabricating the planarization layer 22 on the third metal layer 21, and fabricating the second connection hole and the third via in the planarization layer 22.

S104, fabricating the conductive layer 23 in the second connection hole and the third via, and patterning the conductive layer 23 to form the anode 231 and the connection portion 232.

Wherein, the anode 231 is connected to the drain 212 through the third via (not shown in the figure), and the connection portion 232 is connected to the signal line 213 through the second connection hole (not shown in the figure).

S105, fabricating the pixel definition layer 24 on the conductive layer 23, and patterning the pixel definition layer 24 to form the first opening region 101 and the second opening region 102.

S106, fabricating the first functional layer 25 in the first opening region 101 and the second opening region 102, and on the pixel definition layer 24.

S107, fabricating the light-emitting layer 26 on the first functional layer 25 positioned in the first opening region 101.

S108, fabricating the second functional layer 27 on the light-emitting layer 26, and patterning the second functional layer 27 to form the first connection hole 271.

Wherein, one of methods is to use a metal mask 30 with an opening 31, and use oxygen (O2) to ash the second functional layer 27 and the first functional layer 25 at a position of the opening 31 to remove the functional layer to form a connection hole. Another method is to use a quartz mask. The quartz mask is provided with a light-shielding layer at a position other than the opening. First, ultraviolet light is used to change the characteristics of the functional layer in the opening region. Then, oxygen (O2) is used to perform an ash treatment, and the functional layer exposed to ultraviolet light is removed to form the connection hole.

S109, fabricating the cathode 28 in the first connection hole 271 and on the second functional layer 27.

The present invention further provides a display module including any one of the above display panels. The display module can further include a touch layer.

The present invention further provides an electronic device including any one of the above display modules. The electronic device can be a mobile phone, a tablet computer, a computer, and other equipment.

The display panel, display module, and electronic device of the present invention include a third metal layer disposed on a first metal layer, the third metal layer includes a signal line, a conductive layer is disposed on the third metal layer, and the conductive layer includes an anode and a connection portion. The connection portion is connected to the signal line. A pixel definition layer is disposed on the conductive layer, and the pixel definition layer includes a first opening region and a second opening region. A light-emitting layer is positioned in the first opening region, and a cathode is disposed in the second opening region and disposed on the light-emitting layer and the pixel definition layer. The cathode is connected to the connection portion, and because the cathode is connected to the signal line, impedance of the cathode is reduced, making an in-plane cathode voltage distribution uniform, thereby improving uniformity of brightness.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising:
   a substrate;
   a semiconductor layer disposed on the substrate;
   a first metal layer disposed on the semiconductor layer, wherein the first metal layer comprises a gate;
   a third metal layer disposed on the first metal layer, wherein the third metal layer comprises a signal line, a source, and a drain, and the signal line, the source, and the drain are positioned in a same metal layer;
   a conductive layer disposed on the third metal layer, wherein the conductive layer comprises an anode and a connection portion, and the connection portion is connected to the signal line;
   a pixel definition layer disposed on the conductive layer, wherein the pixel definition layer comprises a first opening region and a second opening region;
   a light-emitting layer positioned in the first opening region; and
   a cathode disposed in the second opening region, and disposed on the light-emitting layer and the pixel definition layer, wherein the cathode is connected to the connection portion.

2. The display panel according to claim 1, further comprising:
   a first functional layer disposed between the pixel definition layer and the light-emitting layer; and
   a second functional layer disposed between the light-emitting layer and the cathode, wherein a first connection hole is defined in the second functional layer, the first connection hole penetrates the second functional layer and the first functional layer, and the cathode is connected to the connection portion through the first connection hole.

3. The display panel according to claim 1, further comprising a planarization layer positioned between the third metal layer and the conductive layer, wherein a second connection hole is defined in the planarization layer, and the connection portion is connected to the signal line through the second connection hole.

4. The display panel according to claim 1, further comprising a second metal layer disposed between the first metal layer and the third metal layer, wherein the second metal layer comprises a metal portion, and the metal portion corresponds to a position of the gate.

5. The display panel according to claim 4, wherein the second metal layer comprises a first conductive portion, and the signal line is connected to the first conductive portion.

6. The display panel according to claim 1, wherein the first metal layer further comprises a second conductive portion, and the signal line is connected to the second conductive portion.

7. The display panel according to claim 1, wherein a first power voltage is connected to the signal line, and the first power voltage is less than a preset value.

8. The display panel according to claim 1, further comprising:
   a first insulating layer disposed between the semiconductor layer and the first metal layer;
   a second insulating layer disposed between the first metal layer and the second metal layer;
   a third insulating layer disposed between the second metal layer and the third metal layer; and
   a first via defined in the third insulating layer, wherein the first via penetrates the first insulating layer, the second insulating layer, and the third insulating layer;
   wherein the third metal layer is further disposed in the first via to form the signal line.

9. A display module, comprising a display panel, wherein the display panel comprises:
   a substrate;
   a semiconductor layer disposed on the substrate;
   a first metal layer disposed on the semiconductor layer, wherein the first metal layer comprises a gate;
   a third metal layer disposed on the first metal layer, wherein the third metal layer comprises a signal line, a source, and a drain, and the signal line, the source, and the drain are positioned in a same metal layer;
   a conductive layer disposed on the third metal layer, wherein the conductive layer comprises an anode and a connection portion, and the connection portion is connected to the signal line;
   a pixel definition layer disposed on the conductive layer, wherein the pixel definition layer comprises a first opening region and a second opening region;
   a light-emitting layer positioned in the first opening region; and
   a cathode disposed in the second opening region, and disposed on the light-emitting layer and the pixel definition layer, wherein the cathode is connected to the connection portion.

10. The display module according to claim 9, wherein the display panel further comprises:
    a first functional layer disposed between the pixel definition layer and the light-emitting layer; and
    a second functional layer disposed between the light-emitting layer and the cathode, wherein a first connection hole is defined in the second functional layer, the first connection hole penetrates the second functional layer and the first functional layer, and the cathode is connected to the connection portion through the first connection hole.

11. The display module according to claim 9, wherein the display panel further comprises:
    a planarization layer positioned between the third metal layer and the conductive layer, a second connection hole is defined in the planarization layer, and the connection portion is connected to the signal line through the second connection hole.

12. The display module according to claim 9, further comprising a second metal layer disposed between the first metal layer and the third metal layer, wherein the second metal layer comprises a metal portion, and the metal portion corresponds to a position of the gate.

13. The display module according to claim 12, wherein the second metal layer comprises a first conductive portion, and the signal line is connected to the first conductive portion.

14. The display module according to claim 9, wherein the first metal layer further comprises a second conductive portion, and the signal line is connected to the second conductive portion.

15. The display module according to claim 9, wherein a first power voltage is connected to the signal line, and the first power voltage is less than a preset value.

16. The display module according to claim 9, further comprising:
- a first insulating layer disposed between the semiconductor layer and the first metal layer;
- a second insulating layer disposed between the first metal layer and the second metal layer;
- a third insulating layer disposed between the second metal layer and the third metal layer; and
- a first via defined in the third insulating layer, wherein the first via penetrates the first insulating layer, the second insulating layer, and the third insulating layer;
- wherein the third metal layer is further disposed in the first via to form the signal line.

17. An electronic device, comprising a display module, wherein the display module comprises a display panel, and the display panel comprises:
- a substrate;
- a semiconductor layer disposed on the substrate;
- a first metal layer disposed on the semiconductor layer, wherein the first metal layer comprises a gate;
- a third metal layer disposed on the first metal layer, wherein the third metal layer comprises a signal line, a source, and a drain, and the signal line, the source, and the drain are positioned in a same metal layer;
- a conductive layer disposed on the third metal layer, wherein the conductive layer comprises an anode and a connection portion, and the connection portion is connected to the signal line;
- a pixel definition layer disposed on the conductive layer, wherein the pixel definition layer comprises a first opening region and a second opening region;
- a light-emitting layer positioned in the first opening region; and
- a cathode disposed in the second opening region, and disposed on the light-emitting layer and the pixel definition layer, wherein the cathode is connected to the connection portion.

18. The electronic device according to claim 17, wherein the display panel further comprises:
- a first functional layer disposed between the pixel definition layer and the light-emitting layer; and
- a second functional layer disposed between the light-emitting layer and the cathode, wherein a first connection hole is defined in the second functional layer, the first connection hole penetrates the second functional layer and the first functional layer, and the cathode is connected to the connection portion through the first connection hole.

* * * * *